US007615416B1

(12) United States Patent
Chock

(10) Patent No.: US 7,615,416 B1
(45) Date of Patent: Nov. 10, 2009

(54) SECURE PACKAGE WITH ANTI-TAMPER PERIPHERAL GUARD RING

(75) Inventor: Raymond O. Chock, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 73 days.

(21) Appl. No.: 11/897,569

(22) Filed: Aug. 31, 2007

(51) Int. Cl.
  *H01L 21/00* (2006.01)
(52) U.S. Cl. .................. 438/127; 257/688
(58) Field of Classification Search ........... 257/688, 257/787; 438/127, 124, 126; 264/251, 272.17
  See application file for complete search history.

(56) References Cited

U.S. PATENT DOCUMENTS

| | | | | |
|---|---|---|---|---|
| 4,801,561 | A * | 1/1989 | Sankhagowit | 29/827 |
| 5,861,662 | A | 1/1999 | Candelore | 257/679 |
| 6,291,884 | B1 * | 9/2001 | Glenn et al. | 257/747 |
| 6,646,565 | B1 | 11/2003 | Fu et al. | 340/687 |
| 7,054,162 | B2 | 5/2006 | Benson et al. | 361/760 |
| 7,065,656 | B2 | 6/2006 | Schwenck et al. | 713/194 |
| 7,169,643 | B1 * | 1/2007 | Hashimoto | 438/110 |
| 2001/0033012 | A1 | 10/2001 | Kommerling et al. | 257/679 |
| 2006/0086534 | A1 | 4/2006 | Oggioni et al. | 174/261 |
| 2006/0087883 | A1 | 4/2006 | Ozguz et al. | 365/185.04 |
| 2006/0170091 | A1 | 8/2006 | Karnezos | 257/686 |
| 2006/0231633 | A1 | 10/2006 | Farooq et al. | 235/492 |
| 2007/0018334 | A1 | 1/2007 | Peytavy et al. | 257/778 |
| 2007/0038865 | A1 | 2/2007 | Oggioni et al. | 713/178 |

OTHER PUBLICATIONS

Web pages from www.amkor.com, 18 pages (downloaded and printed out Apr. 30, 2007).

* cited by examiner

*Primary Examiner*—David A Zarneke
*Assistant Examiner*—Jenny L Wagner
(74) *Attorney, Agent, or Firm*—Imperium Patent Works; Darien K. Wallace; T. Lester Wallace

(57) ABSTRACT

A ball grid array (BGA) package (such as one BGA package of a package-on-package (POP) secure module assembly) includes a substrate, and integrated circuit, and array of bond balls. The BGA package further includes a first amount of encapsulant that covers the integrated circuit and a novel second amount of encapsulant. The novel second amount of encapsulant is a peripheral strip that extends along an edge of the substrate to form a peripheral guard ring. The peripheral guard ring provides an additional amount of anti-tamper security to the BGA package. The guard ring can be fabricated with no or very little additional cost if the guard ring is formed in the same encapsulation step employed to encapsulate the integrated circuit. In some embodiments, the peripheral guard ring is made part of and/or is coupled to anti-tamper circuitry such that if the guard ring is disturbed a tamper condition is detected.

22 Claims, 5 Drawing Sheets

PACKAGE-ON-PACKAGE (POP) SECURE MODULE ASSEMBLY

PERIPHERAL STRIPS OF ENCAPSULANT HELP
PREVENT INTRUSION FROM THE SIDE

BOTTOM VIEW SHOWING
PERIPHERAL STRIPS OF ENCAPSULANT MATERIAL

PACKAGE-ON-PACKAGE (POP)
SECURE MODULE ASSEMBLY

TOP-DOWN PERSPECTIVE VIEW WITH
ENCAPSULANT MATERIAL NOT SHOWN

SECURE PACKAGE WITH ANTI-TAMPER PERIPHERAL GUARD RING

TECHNICAL FIELD

The present invention relates to integrated circuit packaging.

BACKGROUND

Electronic circuitry often must use and store sensitive information such as financial data, account numbers, passwords, personal identification numbers (PIN), access codes, encryption keys, names, addresses, personal information, and other information that is not to fall into the hands of thieves and hackers. For example, credit card purchases are often made at retail stores using a device commonly referred to as a "point of sale" (POS) terminal. The POS terminal is typically coupled to a financial institution via an electronic communication link. A customer at the store may, for example, swipe a credit card through a credit card reader on the POS terminal to pay for merchandise. An encryption key stored in the POS terminal then encrypts information about the transaction including the credit card number and the amount of the transaction, and the encrypted information is communicated from the POS terminal to the financial information. If a thief can obtain access to the encryption key, or can obtain access to the sensitive information, then the thief may be able to make unauthorized purchases or otherwise steal money or use the customer's sensitive information in an unauthorized manner. The sensitive information must, however, generally be stored at least temporarily in circuitry within the POS terminal in order for the POS device to be able to perform its communication function.

To prevent a thief from breaking into a POS terminal and reading sensitive information out of the circuitry of the POS terminal, a mesh of very fine conductors is often employed. This fine mesh (referred to here as an "anti-tamper mesh") is made to cover the circuitry that contains the sensitive information. If the thief were to probe the POS terminal circuitry or to take the POS terminal circuitry apart, then the thief's actions would likely cause conductors of the mesh either to be shorted together or to be severed. There are many variations of anti-tamper mesh structures known in the art. A tamper detect circuit within a volume protected by the mesh is coupled to the mesh and can detect the thief's tampering with the mesh. If a tamper condition occurs, then the tamper detect circuit causes the sensitive information stored in the POS terminal circuitry to be erased before the thief can gain physical access to the circuitry and read the information out of the circuitry.

There are many ways known in the art to protect a volume using an anti-tamper mesh. These ways are effective to different degrees, but generally these known ways of providing the anti-tamper mesh involve an undesirable amount of added cost and/or manufacturing complexity. Even if these ways are established ways that are adequate, it is nevertheless desirable to be able to add to the tamper proof nature of the POS terminal in a cost effective manner, even if the added protection may be slight.

SUMMARY

A package-on-package (POP) secure module assembly includes a first cavity-down ball grid array (BGA) package and a second cavity-down BGA package. The upper surface of the substrate of first BGA package includes an array of lands. The bond balls of the second BGA package attach to the lands on the upper surface of the first BGA package so that the second BGA package is piggy-back mounted onto the first BGA package.

The first BGA package includes a substrate, an integrated circuit, an array of bond balls, a first amount of encapsulant that encapsulates the integrated circuit, and a second amount of encapsulant that forms a peripheral strip. The encapsulant material may, for example, be a type of encapsulant commonly used to encapsulate integrated circuits such as an epoxy-resin material. The peripheral strip of encapsulant extends around a peripheral edge of the bottom of the substrate of the first BGA package. In one example, the peripheral strip is a closed guard ring that extends along the entire peripheral edge of the substrate of the first BGA package. None of the encapsulant of the peripheral strip extends between any two adjacent ones of the bond balls of the first BGA package.

The second BGA package includes a substrate, an integrated circuit, an array of bond balls, a first amount of encapsulant that encapsulates the integrated circuit, and a second amount of encapsulant that forms a peripheral strip. The second amount of encapsulant is a peripheral strip that extends around a peripheral edge of the bottom of the substrate of the second BGA package. In one example, the peripheral strip is a closed guard ring that extends along the entire peripheral edge of the substrate of the second BGA package.

The encapsulant guard rings of the first and second BGA packages at least somewhat impede unauthorized access to the POP assembly from the side. The guard rings serve to obscure open views of the grids of bond balls within the POP assembly, and to provide physical barriers to probing of the POP assembly from the side. Even if the guard rings do not entirely prevent unauthorized access and/or probing of the POP assembly from the side, adding the guard rings nevertheless provides an additional amount of anti-tamper security to the POP assembly. In situations in which the cost of providing the guard rings is minimal or nonexistent, providing the guard rings is a cost effective way to reduce the susceptibility of the overall POP assembly to tampering and unauthorized access.

In one advantageous aspect, the first and second amounts of encapsulant are simultaneously applied to a substrate of a BGA package in a single screen printing step. Because the integrated circuit of the BGA package must be encapsulated in the screen printing step, providing the additional guard ring of encapsulant does not require any additional processing steps. Providing the encapsulant guard rings therefore involves no or very little additional cost as compared to the same structure without the encapsulant guard rings. In some embodiments, the second amount of encapsulant is a conductive encapsulant. In some embodiments, the second amount of encapsulant covers anti-tamper contacts or anti-tamper bond balls or other anti-tamper conductors. The second amount of encapsulant may be applied either before bond ball attachment or after bond ball attachment, depending on the structure of the particular secure BGA package being fabricated.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
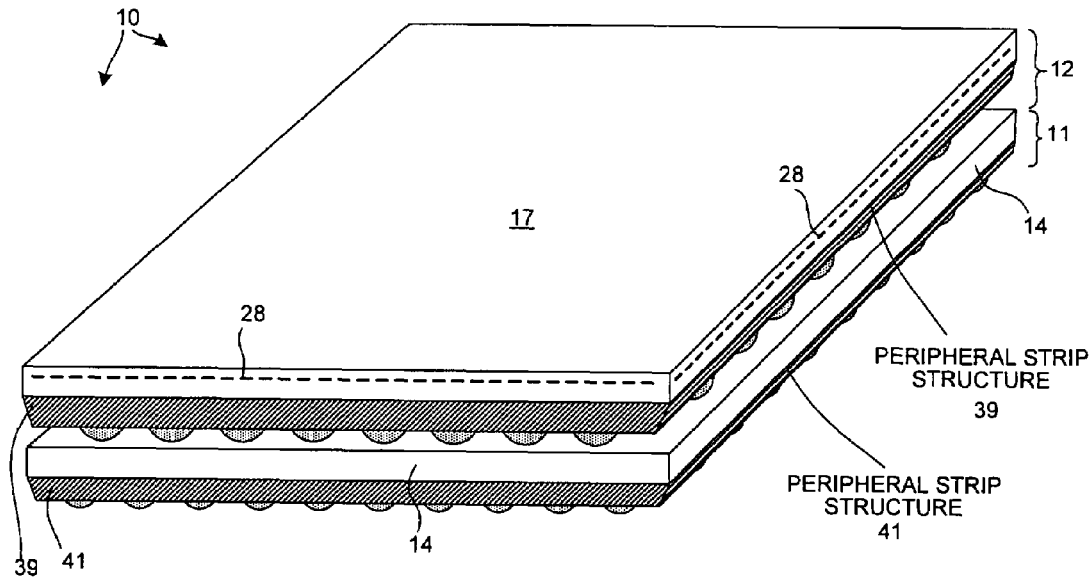
FIG. 1 is a perspective view of the top of a package-on-package (POP) secure module assembly 10 in accordance with one novel aspect.

FIG. 1 is a perspective view of a package-on-package (POP) secure module assembly 10 in accordance with one novel aspect. POP assembly 10 includes a first cavity-down ball grid array (BGA) integrated circuit package 11 and a second cavity-down BGA integrated circuit package 12. Each of the first and second BGA packages 11 and 12 includes a substrate, a grid array of bond balls, an integrated circuit die connected to the substrate, and an amount of encapsulant that encapsulates the integrated circuit. The top surface of the substrate of first BGA package 11 includes an array of lands. The bond balls on the bottom of second BGA package 12 are fixed to the array of lands on the top of first BGA package 11 so that second BGA package 12 is fixed to first BGA package 11 in standard piggy-back fashion.

Figure 2:
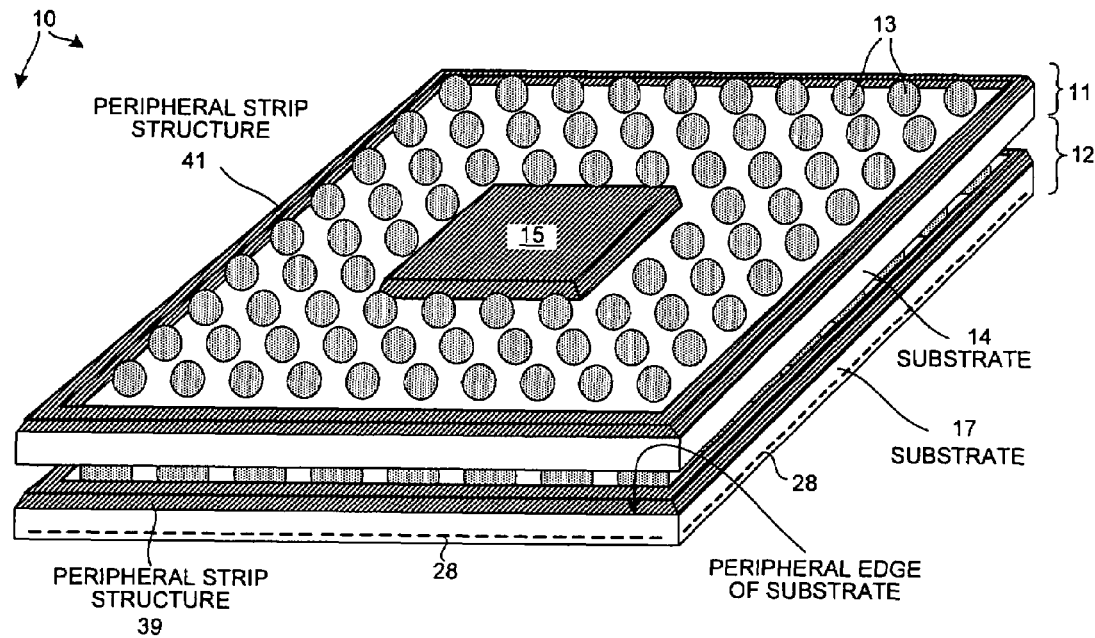
FIG. 2 is a perspective view of the bottom of the POP assembly 10 of FIG. 1.

FIG. 2 is a perspective view of the bottom of POP assembly 10. The grid array of bond balls 13 is illustrated extending in two perpendicular directions a plane. Each bond ball of this grid array is attached to the substrate 14 of the first BGA package 11. A first amount 15 of encapsulant encapsulates the integrated circuit die 16 of first BGA package 11.

Figure 3:
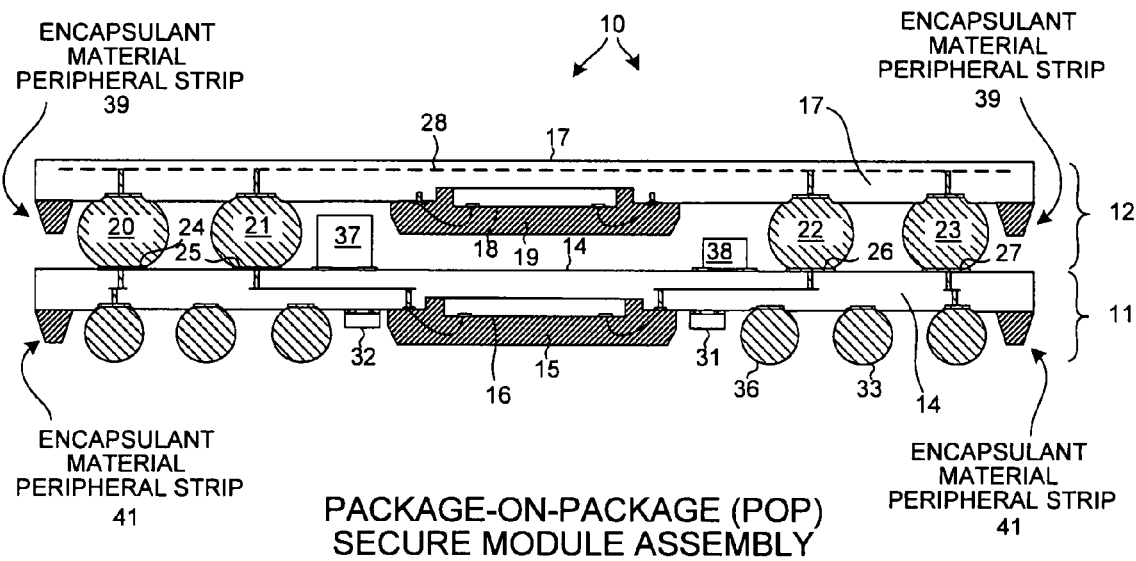
FIG. 3 is a cross-sectional view of the POP assembly 10 of FIGS. 1 and 2.

FIG. 3 is a cross-sectional side view of the POP assembly 10 of FIGS. 1 and 2. The integrated circuit of first BGA package 11 is indicated by reference numeral 16. Second BGA package 12 includes substrate 17, an integrated circuit 18, a first amount 19 of encapsulant that encapsulates integrated circuit 18, and a grid array of bond balls of which bond balls 20-23 are a part. The lands to which bond balls 20-23 are fixed are designated with reference numerals 24-27.

In the illustrated example, integrated circuit 18 includes tamper detect circuitry. The tamper detect circuitry is coupled to two conductors of an anti-tamper mesh of conductors. The anti-tamper mesh of conductors includes a planar mesh 28 disposed in an upper layer of metal within substrate 17 of second BGA package 12. The conductors of mesh 28 are approximately 0.2 millimeters wide and are spaced at approximately 0.2 millimeters from one another. Substrate 17 is an epoxy resin fiberglass reinforced printed circuit board of a type customarily used in BGA packages.

The anti-tamper mesh of conductors, rather than just consisting of horizontal planar mesh 28 within substrate 17, is also made to cup down around the side edges of POP assembly 10 in the vertical dimension. The two conductors of the anti-tamper mesh are made to meander vertically up and down through the bond balls of the first and second BGA packages 11 and 12 so as to form a picket fence like security structure that surrounds the integrated circuit dice 16 and 18 in the lateral dimension. A "picket" here involves a connection from a bond ball of second BGA package 12, through a land on the upper surface of first BGA package 11, then down through substrate 14, and through a bond ball of first BGA package 11 such that the two bond balls and the connection between them form a substantially vertical conductive path.

Figure 4:
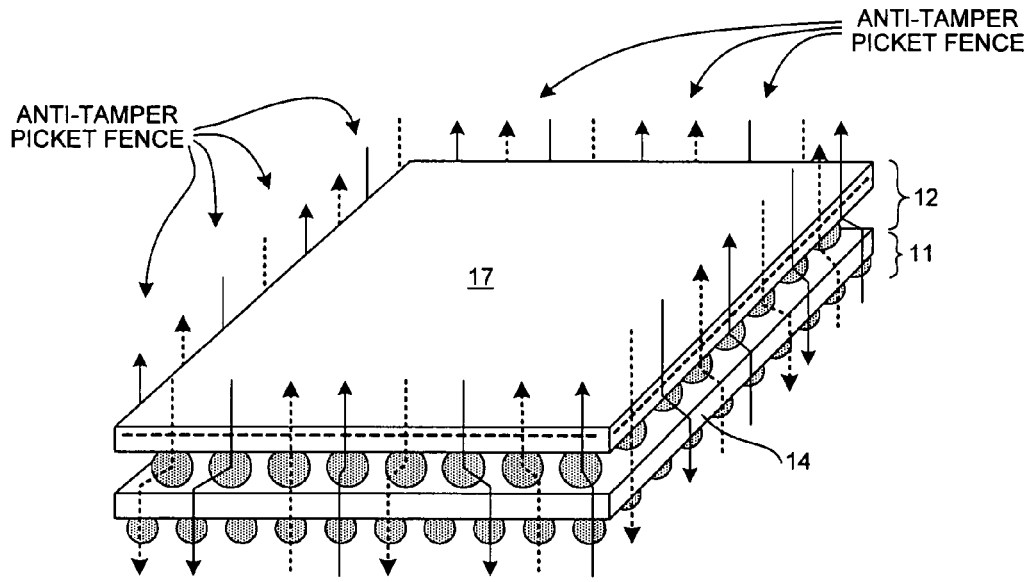
FIG. 4 is a perspective view that illustrates the pickets of the anti-tamper mesh of the POP assembly 10 of FIGS. 1-3.

FIG. 4 shows numerous such pickets. The arrows drawn with the solid line represent pickets that are parts of a first conductor 29 of the mesh. The arrows drawn with the dashed line represent pickets that are parts of a second conductor 30 of the mesh. The picket fence like security structure helps protect against probing of the module from the sides.

Figure 5:
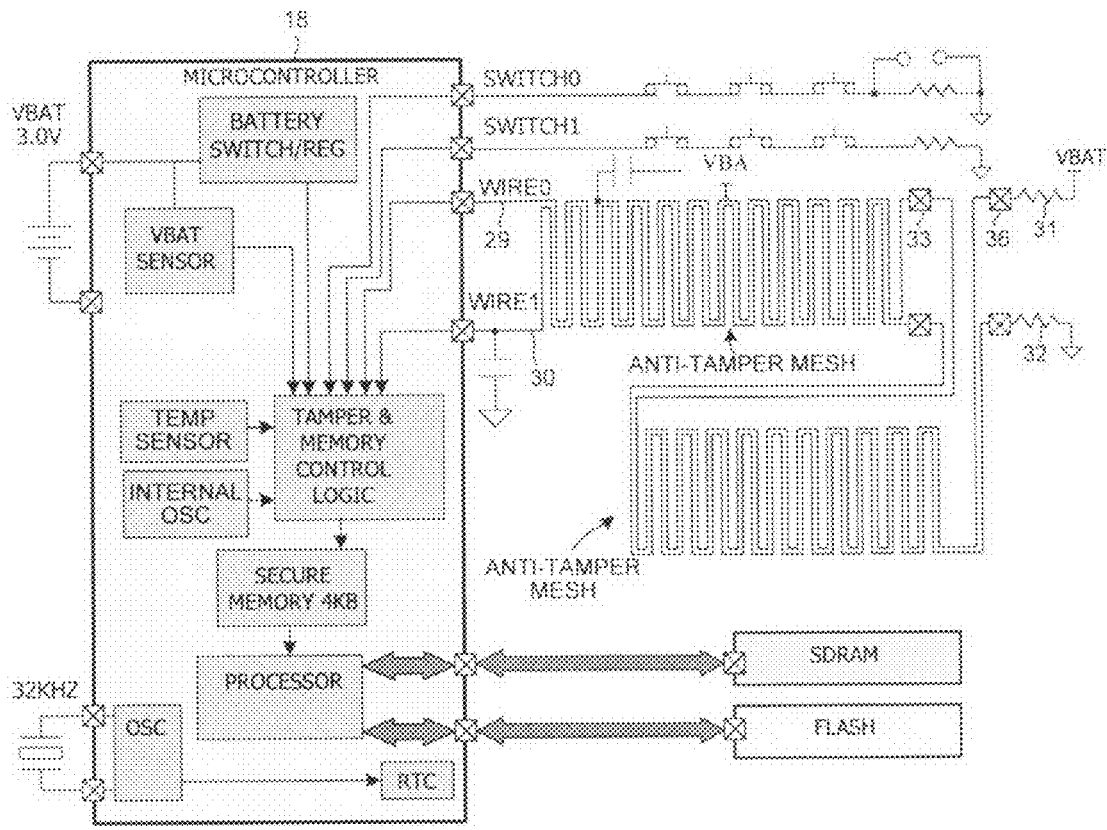
FIG. 5 is a circuit diagram that shows how the integrated circuit 18 of the second BGA package 12 of FIGS. 1-3 is connected to the anti-tamper mesh of conductors.

FIG. 5 is a simplified schematic circuit diagram that shows integrated circuit 18 coupled to the two conductors 29 and 30 of the anti-tamper mesh. Conductor 29 (WIRE0) is terminated by a resistor 31. Conductor 30 (WIRE1) is terminated by a resistor 32. In the illustrated example, these resistors 31 and 32 are disposed on the bottom of substrate 14 of first BGA package 11. One conductor 29 (WIRE0) extends from a terminal on integrated circuit 18, through a bond wire, through substrate 17, up and down around the periphery of assembly 10 through pickets, and back and forth across the major dimension of substrate 17 in mesh layer 28, and then down through bond ball 22, land 26, through substrate 14, through bond ball 33, through a mesh 34 of horizontally extending conductors underneath assembly 10 in a printed circuit board 35 to which assembly 10 is attached, then back up through bond ball 36, through substrate 14, and to the first terminal of resistor 31. The second terminal of resistor 31 is coupled within substrate 14 to a conductor carrying the battery voltage VBAT. It is therefore seen that the connection from POP assembly 10 to the mesh 34 in printed circuit board 35 is made using bond balls that are not on the periphery of POP assembly 10 but rather are inner bond balls. The conductor 30 (WIRE1) extends parallel to conductor 29 back and forth across in the plane of mesh 28, and up and down through pickets, and back and forth in the horizontal dimension through mesh 34 in printed circuit board 35, and back up through an inner bond ball of first BGA package 11 to a first terminal of resistor 32. The second terminal of resistor 32 is connected to a ground conductor as indicated in FIG. 5.

Discrete components (for example, capacitors 37 and 38) are surface mounted to corresponding lands on the upper surface of substrate 14 so that the components are within the volume protected by the anti-tamper mesh. The tamper detect circuitry within integrated circuit 18 detects tamper conditions such as if one of the conductors 29 or 30 is severed, or if the two conductors 29 and 30 are shorted together. In other embodiments, the tamper detect circuitry can also detect changes in other electrical characteristics of the conductors to detect a tamper condition. If the tamper detect circuitry detects a tamper condition, then the tamper detect circuitry causes sensitive information stored in the POP assembly 10 to be erased. In one example, this sensitive information includes information stored in integrated circuit 16. For additional information on the operation of integrated circuit 18 see: U.S. patent application Ser. No. 10/918,272, entitled "Secure Transaction Microcontroller With Secure Boot Loader", filed Aug. 13, 2004, by Hsiang et al. (the subject matter of which is incorporated herein by reference).

In one novel aspect, second BGA package 12 includes a second amount 39 of the same encapsulant material that encapsulates integrated circuit 18. In one example, second amount 39 of encapsulant is a peripheral strip that extends adjacent to and along the square peripheral edge of the bottom surface of substrate 17. Second amount 39 of encapsulant therefore forms a square guard ring structure. The first and second amounts of the encapsulant are not contacting one another. The bottom extent of guard ring structure 39 is in the same horizontal plane (see FIGS. 3 and 6) as the bottom extent of the first amount 19 of encapsulant that covers integrated circuit 18.

In one example, second BGA package 12 is fabricated by screen printing the encapsulant in liquid form onto the bottom side of substrate 17. The liquid encapsulant material includes a solvent. A squeegee is used to push the liquid material over and through appropriate placed and sized openings in a stencil (i.e., screen) so as to form the two amounts 19 and 39 of liquid encapsulant at appropriate places on substrate 17. The first amount of encapsulant covers the integrated circuit die 18 that has already been wire bonded to substrate 17. The two amounts 19 and 39 of liquid encapsulant are then allowed to cure and/or are baked so that the two amounts 19 and 39 harden to form the structures shown in FIGS. 1-3. The grid array of bond balls are formed after the encapsulation step using conventional processes.

The curable encapsulant may be any suitable encapsulant known in the art or cited in packaging literature for encapsulating integrated circuits such as, for example, an epoxy-resin material or a urethane material or a UV curable material or a silicone material. Because the two amounts 39 and 19 of encapsulant are applied in the same step using the same stencil, there is very little or no extra cost associated with adding the guard ring 39. In some cases, substrate 17 must be made somewhat larger to provide space for guard ring 39, but the cost incurred due to this small increase in substrate size is minimal. Providing the novel guard ring 39 may not prevent a dedicated thief from gaining access to the POP assembly 10 from the side, but guard ring 39 does provide some measure of addition obstruction and complexity for the thief to overcome. Guard ring 39 provides a physical and/or visual obstruction between the outside of POP assembly 10 and the bond balls of second BGA package 12.

Figure 6:
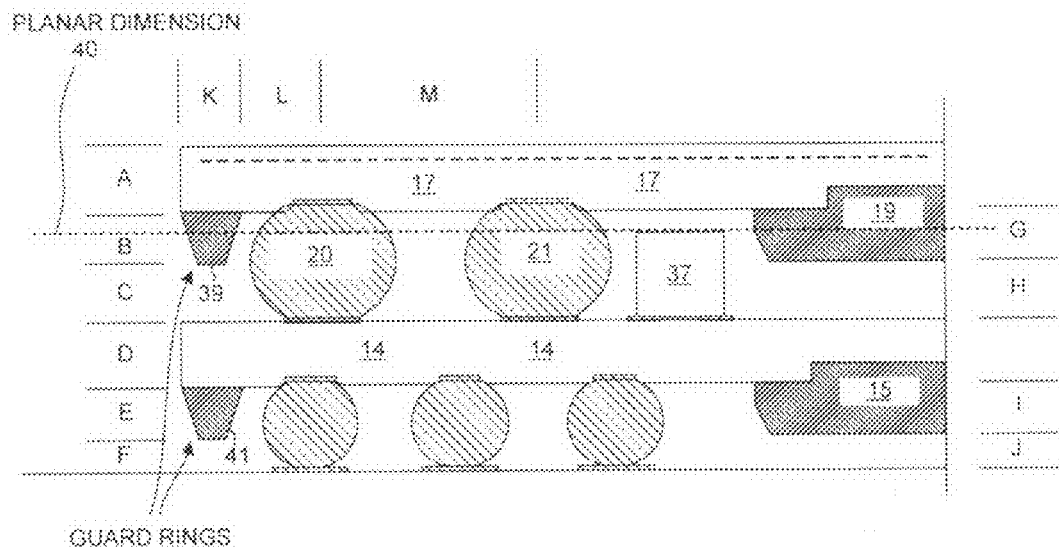
FIG. 6 is a cross-sectional view of the left half of the POP assembly 10 of FIGS. 1-3.
Figure 7:
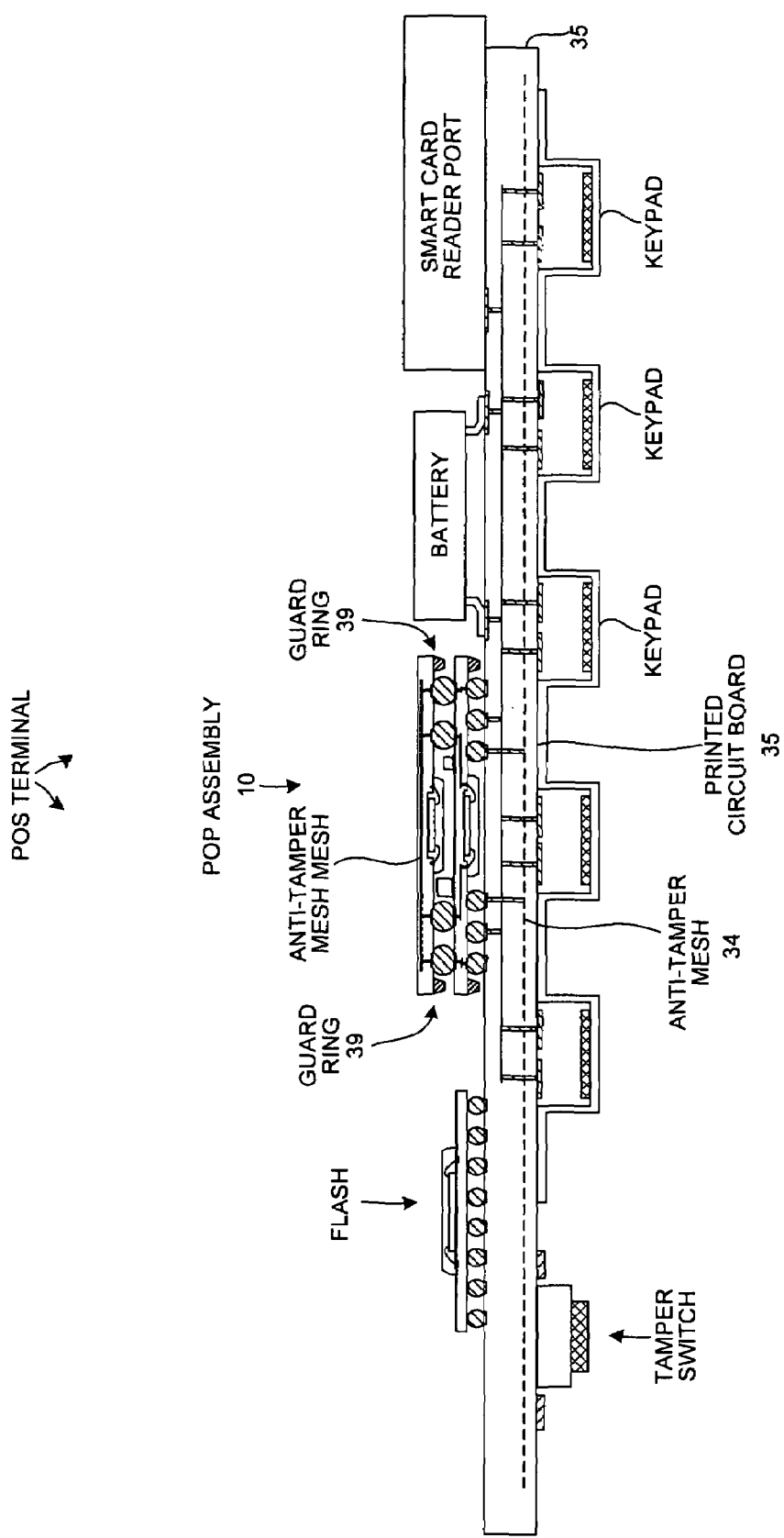
FIG. 7 is a cross-sectional view of a point of sale (POS) terminal that includes the POP assembly 10 of FIGS. 1-3.

FIG. 6 is an expanded cross-section view of the left half of FIG. 3. The grid array of bond balls of second BGA package 12 (including bond balls 20 and 21) extends in two perpendicular directions in a planar dimension 40. As illustrated in FIG. 6, guard ring 39 is a closed ring structure that surrounds the grid array of bond balls in planar dimension 40. In the present example, first BGA package 11 also has a second amount 41 of encapsulant that forms a second ring structure. This second ring structure 41 extends downward from the substrate 14 of the first BGA package 11. Guard ring 41 surrounds the bond balls of the first BGA package 11 in a similar fashion to the way that the guard ring 39 surrounds the bond balls of the second BGA package 12. As with guard ring 39 of second BGA package 12, the encapsulant material of guard ring 41 is formed in the same step as the amount 15 of encapsulant that encapsulates integrated circuit 16 of first BGA package 11. The additional cost of providing guard ring 41 is minimal, and providing guard ring 41 does provide an additional barrier to a thief who might attempt to gain unauthorized access to POP assembly 10.

In the specific example of FIG. 6, the approximate dimensions A through M in units of millimeters are as follows: A=0.2, B=0.4, C=0.1, D=0.2, E=0.3, F=0.1, G=0.4, H=0.1, I=0.3, J=0.1, K=0.4, L=0.3, and M=0.65. In the example of FIG. 6, the bond balls extend downward away from the bottom side of substrate 17 a distance that is at least as far as guard ring 39 extends downward away from the bottom surface of substrate 17, and is less than twice as far as guard ring 39 extends downward away from the bottom surface of substrate 17.

None of the encapsulant of guard ring 39 extends between any two adjacent ones of the bond balls of second BGA package 12. Accordingly, concerns of differential thermal expansion and contraction between the encapsulant and the substrate are minimized. Shrinking or expanding encapsulant cannot crack or dislodge bond balls. The guard ring is a thin structure that does not cause warping of the substrate if the encapsulant of the guard ring expands or contracts at a different rate than the material of the substrate expands or contracts.

Figure 8:
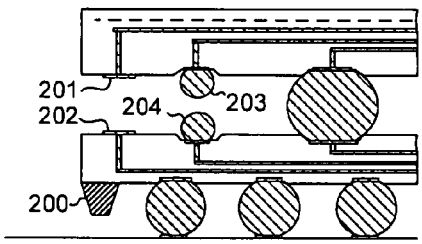
FIGS. 8-15 illustrate alternative tamper detect and guard ring structures that can be mixed and matched in different permutations to make a secure package or a secure POP assembly.

FIGS. 8-15 are partial cross-sectional views of alternative tamper detect and guard ring structures that can be mixed and matched in different permutations to make a secure package or a secure POP assembly. FIG. 8 shows an embodiment in which the lower BGA package of the POP assembly includes a peripheral guard ring 200 of encapsulant, but the upper BGA package does not. The upper BGA package includes opposing pad-like contacts 201 and 202, each of which is electrically coupled to the tamper detect circuitry of integrated 18. The upper BGA package also includes a pair of opposing tamper half-balls 203 and 204 (substantially spherical bond balls of less than one half the height of the ordinary bond balls of the upper BGA package). Each of these opposing tamper half-balls 203 and 204 is coupled to the tamper detect circuitry of integrated circuit 18. If a thief were to attempt to probe the POP assembly from the side, then the probe may contact the opposing contacts or the opposing tamper half-balls such that a tamper condition would be detected.

Figure 9:
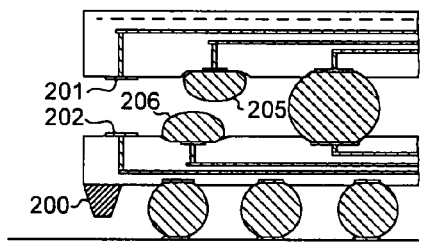

FIG. 9 illustrates the structure of FIG. 8, except that wider and offset tamper half-height bond balls 205 and 206 are used in place of the tamper half-balls 203 and 204 of FIG. 8.

Figure 10:
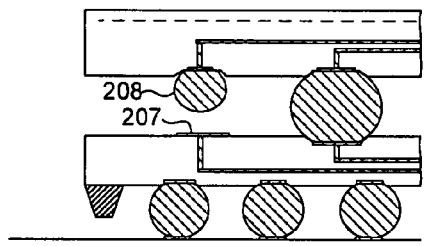

FIG. 10 illustrates an alternative structure in which a pad-like contact 207 is disposed opposite a three-quarter height tamper bond ball 208. Both the pad-like contact 207 and the three-quarter height tamper bond ball 208 are connected the tamper detect circuitry of integrated circuit 18.

Figure 11:
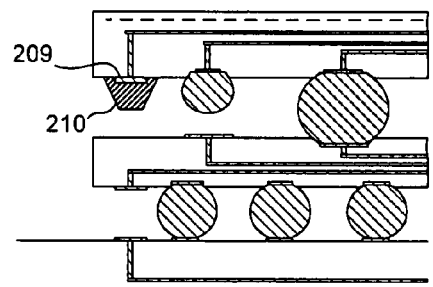

FIG. 11 illustrates an alternative structure in which a tamper contact or pad 209 is covered and/or obscured by a guard ring 210 of encapsulant. Guard ring 210 can be made of either a conductive encapsulant or a non-conductive encapsulant.

Figure 12:
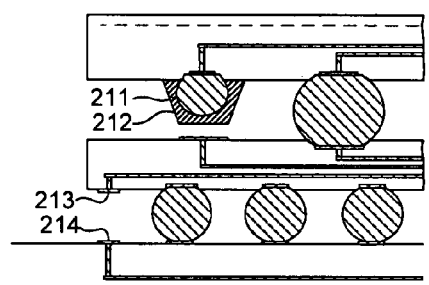

FIG. 12 illustrates an alternative structure in which a three-quarter height tamper bond ball 211 is covered and/or obscured by a guard ring 212 of encapsulant. Guard ring 212 can be made of either a conductive encapsulant or a non-conductive encapsulant.

Figure 13:
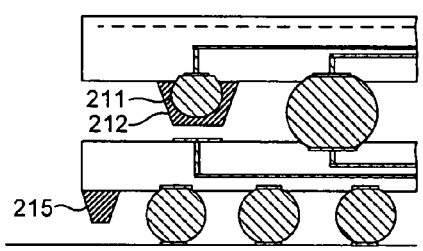

FIG. 13 shows the structure of FIG. 12, except that the opposing tamper contacts 213 and 214 in the bottom BGA package of FIG. 12 are not provided and a guard ring 215 of encapsulant is provided in their place.

Figure 14:
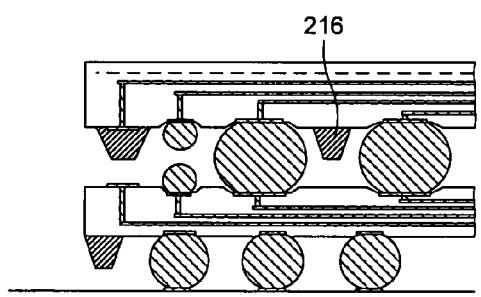

FIG. 14 shows another structure. In this structure a third amount 216 of encapsulant is provided between adjacent bond balls.

Figure 15:
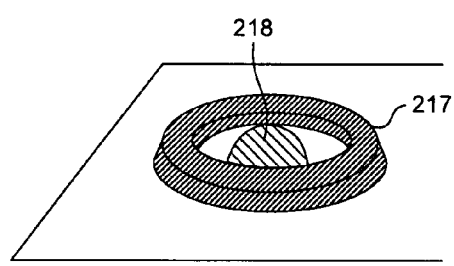

FIG. 15 illustrates a structure in which in an amount 217 of encapsulant is formed in a ring around a bond ball 218 within a POP assembly. It may be that only some bond balls of a POP secure module assembly need to be protected from tampering. In such a case, each of these bond balls may be encircled by a separate ring of encapsulant, whereas the other bond balls that need not be protected are not provided with their own rings of encapsulant.

In each of the examples of FIGS. 8-15, the peripheral strip or guard ring of encapsulant can be formed in the same step as is the encapsulant that encapsulates an integrated circuit of the POP assembly. The peripheral strip or guard ring of encapsulant is formed in the same encapsulation step in order to minimize the added cost of providing the peripheral strip or guard ring. The encapsulation step can occur either before or after bond ball formation. It is, however, possible to form the novel peripheral strip or guard ring in an encapsulation step other than the encapsulation step that forms the encapsulation over the integrated circuit die. In one example, first amount 19 of encapsulant that encapsulates integrated circuit 18 is a first type of encapsulant (for example, a nonconductive epoxy-resin encapsulant), whereas the second amount 39 of encapsulant is an encapsulant of a second type (for example, a conductive encapsulant). The conductive encapsulant is applied in a second screen printing step. The conductive encapsulant can be made conductive by embedding a conductive metal power in an epoxy-resin base material as is known in the art. If, for example, such conductive encapsulant is provided between two tamper contacts or between two tamper bond balls, and if a thief were to remove the encapsulant to gain access to the POP assembly, then the normal low resistance afforded by the conductive encapsulant would likely no longer be present and the detected resistance between the tamper contacts or tamper bond balls would increase. This increase in resistance can be detected by integrated circuit 18 as a tamper condition. If the same base epoxy-resin material is used for both guard ring 39 and for encapsulant 19 that encapsulates the integrated circuit 18, then an attempt to dissolve the encapsulant 19 covering the integrated circuit would also likely dissolve the guard ring 39 and would be detected as a tamper condition. The conductive encapsulant used to sense the tamper condition need not be disposed at the peripheral edge of the POP assembly, but rather may be disposed within the center of the POP assembly, thereby making the selective dissolving or removal of the two pieces of encapsulant more difficult. Guard ring 39 is a thinner structure than is the first amount 19 of encapsulant so attempts to dissolve the first amount 19 of encapsulant to expose integrated circuit 18 would tend to dissolve the guard ring 39 before the encapsulant 19 that covers the integrated circuit 18.

Although certain specific exemplary embodiments are described above in order to illustrate the invention, the invention is not limited to the specific embodiments. Although an example is described above in which each BGA package includes one integrated circuit, in other embodiments a BGA package may include more than one integrated circuit or may include no integrated circuit but rather may include discrete components only. The novel guard ring structure may be provided even if no encapsulant is provided in the center portion of a BGA package to encapsulate an integrated circuit. The peripheral strip of encapsulant may be a strip that does not form a closed guard ring. Multiple peripheral anti-tamper strips may be provided on a single BGA package rather than a single ring of encapsulant.

In a broad sense, relatively inexpensive screen printing is used to form a peripheral obstruction or guard ring on a secure integrated circuit package or module, such that the peripheral obstruction or guard ring makes probing or examining the secure integrated circuit package or module from the side more difficult. In one advantageous aspect, the screen printing step in which the peripheral obstruction or guard ring is formed is the same screen printing step that forms the encapsulate that covers an integrated circuit die of the secure integrated circuit package or module. In some embodiments, the material of the guard ring is a material that is different than the encapsulant that covers the integrated circuit. The material need not be an encapsulant and need not be applied in a screen printing step. For example, the guard ring structure may be preformed or fashioned from a sheet, and then fixed or otherwise laminated to a substrate structure. The guard ring may be made of particularly durable material that can sustain high temperatures, and that is difficult to dissolve using chemical solvents, and that is difficult to drill through or cut through. An encapsulant guard ring can be disposed on and extend upward from the upper surface of substrate 14 in addition to the encapsulant guard ring 39 that is disposed on and extends downward from the bottom surface of substrate 17. The two opposing encapsulant guard rings can overlap one another or can be formed to key together. Accordingly, various modifications, adaptations, and combinations of various features of the described embodiments can be practiced without departing from the scope of the invention as set forth in the claims.

What is claimed is:

1. A method comprising:
   (a) fixing an integrated circuit die to a substrate, wherein the integrated circuit die includes tamper-detect circuitry and wherein the substrate includes an anti-tamper mesh of conductors; and
   (b) in a single step, placing an encapsulant material onto a first side of the substrate and onto the integrated circuit die such that a first amount of the encapsulant material covers the integrated circuit die, and such that a second amount of the encapsulant material is disposed on the first side of the substrate so that the second amount of encapsulant forms a ring structure that surrounds the first amount of encapsulant, wherein the first and second amounts of encapsulant are separate amounts of encapsulant that do not contact one another.

2. The method of claim 1, further comprising:
   (c) forming a grid array of bond balls so that the ring structure surrounds the grid array of bond balls, wherein each bond ball of the grid array is attached to the first side of the substrate.

3. The method of claim 1, further comprising:
   (c) attaching bond balls to the first side of the substrate so that the bond balls form a grid array of bond balls and so that the ring structure surrounds the grid array of bond balls.

4. The method of claim 1, wherein step (b) involves screen printing the encapsulant onto the substrate.

5. The method of claim 1, wherein the encapsulant is an epoxy-resin material.

6. The method of claim 2, wherein the bond balls extend away from the first side of the substrate a first distance, wherein the ring structure extends away from the first side of the substrate a second distance, wherein the second distance greater than half the first distance but is less than the first distance.

7. The method of claim 1, wherein the substrate is a printed circuit board that includes multiple layers of conductors.

8. An apparatus comprising:
   a ball grid array (BGA) integrated circuit package including a substrate, an integrated circuit die, an array of bond balls that extends in two perpendicular directions in a plane, and a first amount of an encapsulant that covers the integrated circuit die, wherein the integrated circuit die is fixed to a first side of the substrate, and wherein the array of bond balls is fixed to the first side of the substrate; and
   means for surrounding the integrated circuit die in the plane with a second amount of an encapsulant, wherein the second amount of the encapsulant does not contact the first amount of the encapsulant.

9. The apparatus of claim 8, wherein the means is a ring of the encapsulant, wherein the ring extends along a peripheral edge of the substrate.

10. The apparatus of claim 8, wherein the encapsulant of the first amount of encapsulant is a first type of encapsulant material, and wherein the encapsulant of the second amount of encapsulant is a second type of encapsulant material.

11. The apparatus of claim 8, wherein the means comprises a conductor that is in contact with the encapsulant, wherein the integrated circuit includes tamper detect circuitry, and wherein the conductor is coupled to the tamper detect circuitry.

12. The method of claim 1, wherein the tamper-detect circuitry is coupled to the anti-tamper mesh of conductors.

13. The method of claim 2, wherein none of the second amount of the encapsulant material extends between any two adjacent ones of the bond balls of the grid array of bond balls.

14. The method of claim 3, wherein the first amount of the encapsulant material does not cover any of the bond balls.

15. The method of claim 3, wherein the substrate, the grid array of bond balls, the integrated circuit die, the first amount of the encapsulant material, and the second amount of the encapsulant material together are a ball grid array (BGA) integrated circuit package having a guard ring.

16. The method of claim 1, wherein the first side of the substrate extends in a first plane, wherein the first amount of the encapsulant material has an exposed and substantially planar surface that extends in a second plane parallel to the first plane, and wherein the ring structure has an exposed and substantially planar surface that extends in the second plane.

17. The method of claim 1, wherein the second amount of the encapsulant material conceals and contacts a tamper-detect conductor, wherein the tamper-detect conductor is electrically coupled to the integrated circuit die.

18. The method of claim 1, wherein the second amount of the encapsulant material contacts a conductor, and wherein the conductor is coupled to the tamper-detect circuitry.

19. The method of claim 1, wherein the encapsulant material is electrically conductive.

20. The apparatus of claim 8, wherein the first side of the substrate includes an array of lands, and wherein the bond balls are fixed to the array of lands.

21. The apparatus of claim 8, wherein the substrate is a printed circuit board that includes multiple layers of conductors.

22. The apparatus of claim 8, wherein the substrate is a rigid printed circuit board.

* * * * *